United States Patent
Wu et al.

(10) Patent No.: US 10,121,638 B1
(45) Date of Patent: Nov. 6, 2018

(54) ATMOSPHERIC-PRESSURE PLASMA JET GENERATING DEVICE

(71) Applicant: National Chiao Tung University, Hsinchu (TW)

(72) Inventors: Jong-Shinn Wu, Hsinchu (TW); Chih Tung Liu, Taipei (TW); Chun Ping Hsiao, Taichung (TW); Mu Chien Wu, Tainan (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 16/003,514

(22) Filed: Jun. 8, 2018

(30) Foreign Application Priority Data

Feb. 13, 2018 (TW) .............................. 107105165 A

(51) Int. Cl.
*H01J 37/32* (2006.01)
*H05H 1/24* (2006.01)
*H05H 1/46* (2006.01)

(52) U.S. Cl.
CPC ..... *H01J 37/32009* (2013.01); *H05H 1/2406* (2013.01); *H05H 2001/245* (2013.01);
(Continued)

(58) Field of Classification Search
CPC ................. H01J 37/32; H01J 37/32009; H01J 37/32366; H05H 1/24; H05H 1/2406;
(Continued)

(56) References Cited

U.S. PATENT DOCUMENTS

| 5,961,772 A * | 10/1999 | Selwyn | H01J 37/32192 118/723 ER |
| 6,429,400 B1 * | 8/2002 | Sawada | H01J 37/32366 219/121.43 |

(Continued)

FOREIGN PATENT DOCUMENTS

EP   1689216 A1   8/2006

OTHER PUBLICATIONS

Spencer P. Kuo, "Air plasma for medical applications," J. Biomedical Science and Engineering, 5, 481-495, 2012.
(Continued)

*Primary Examiner* — Thai Pham
(74) *Attorney, Agent, or Firm* — Muncy, Geissler, Olds & Lowe, P.C.

(57) ABSTRACT

An atmospheric-pressure plasma jet generating device is disclosed, which comprises a housing, a discharge tube, an air inlet, and an outlet. The air inlet is connected to the outlet and the discharge tube. The discharge tube includes an internal electrode, a first dielectric material, and an external electrode. The first dielectric material is placed between the external electrode and the internal electrode, and there are some channels between internal electrode and first dielectric tube. An external power source is electrically connected to the internal electrode and the external electrode to generate a high electric field within the discharge tube. When the working gas flows through the discharge tube from the air inlet, the plasma is generated by the high electric field, and then flows out through the outlet. The present invention can generate non-thermal atmospheric-pressure plasma jet for biomedical processing.

9 Claims, 14 Drawing Sheets

(52) U.S. Cl.
CPC ............... *H05H 2001/2412* (2013.01); *H05H 2001/466* (2013.01); *H05H 2240/10* (2013.01); *H05H 2245/1225* (2013.01)

(58) Field of Classification Search
CPC ..... H05H 2001/245; H05H 2001/2456; H05H 2001/2412
See application file for complete search history.

(56) References Cited

U.S. PATENT DOCUMENTS

| | | | | |
|---|---|---|---|---|
| 8,399,794 | B2* | 3/2013 | Tsuji | H01J 37/32366 118/723 R |
| 8,471,171 | B2 | 6/2013 | Price | |
| 8,552,335 | B2* | 10/2013 | Rego | H05H 1/2406 219/121.52 |
| 2005/0016456 | A1* | 1/2005 | Taguchi | H05H 1/2406 118/723 E |
| 2013/0026137 | A1* | 1/2013 | Kindel | H05H 1/48 216/67 |
| 2015/0340207 | A1* | 11/2015 | Holbeche | A61B 18/042 156/345.33 |

OTHER PUBLICATIONS

Klaus D. Weltmann et al., "Atmospheric Pressure Plasma Jet for Medical Therapy: Plasma Parameters and Risk Estimation," Contrib. Plasma Phys., 49, 9, 631-640, 2009.

Traylor, Matthew J., et al. "Long-term antibacterial efficacy of air plasma-activated water." Journal of Physics D: Applied Physics 44.47 (2011): 472001., pp. 1-4.

Takaki, K., et al. "Improvements in plant growth rate using underwater discharge." Journal of Physics: Conference Series. vol. 418. No. 1. IOP Publishing, 2013., 8 pages.

* cited by examiner

ATMOSPHERIC-PRESSURE PLASMA JET GENERATING DEVICE

This application claims priority for Taiwan patent application no. 107105165 filed on Feb. 13, 2018, the content of which is incorporated by reference in its entirety.

BACKGROUND OF THE INVENTION

Field of the Invention

The present invention relates to a plasma generating device, particularly to an atmospheric-pressure plasma jet generating device with a channeled electrode.

Description of the Prior Art

In general, plasma is generated via applying an electromagnetic field to neutral gases. The gas temperature and electron density of plasma ranges widely. Therefore, plasma has numerous applications such as plasma spray coating, semiconductor etching, metal cutting, metal welding, vehicle exhaust purification, and fluorescent lamps.

At present, non-thermal (near the room temperature) atmospheric-pressure plasma is normally generated using inert gases. In fewer studies, a higher breakdown voltage is applied to ionize nitrogen, air, or even oxygen. However, the electron affinity of oxygen at atmospheric pressure is so strong that oxygen is easy to capture the electrons from plasma. Thus, it is very difficult to maintain the plasma in a steady state. Besides, under such operating condition, excessive voltage may result in high temperature or generating an unintended high concentration of ozone. Therefore, this kind of plasma thereby is unsuitable to be used in biomedical therapies and temperature-sensitive materials.

Nowadays, there are few researches generating plasma activated water in high volume at atmospheric pressure. Using air as the working gas to generate plasma activated water for water purification, some poisonous substance such as nitrite ions are generated in the meantime, causing the death of aquatic animals, furthermore causing the damage to ecology.

Owing to the above mentioned problems, the present invention proposes an atmospheric-pressure plasma jet generating device to provide non-thermal atmospheric-pressure plasma, which may be applied to temperature-sensitive materials or generate plasma activated water.

SUMMARY OF THE INVENTION

The primary objective of the present invention is to provide an atmospheric-pressure plasma jet generating device, which can generate a non-thermal (near the room temperature) plasma jet under atmospheric pressure with low energy consumption. The plasma jet generated by the present invention can sterilize microbes without harming living bodies which may replace the conventional antibiotic disinfection method and prevent from antibiotic resistance. The plasma jet generated by the present invention can directly contact human bodies for hemostasis, disinfection, teeth whitening, and wound healing.

Another objective of the present invention is to provide an atmospheric-pressure plasma jet generating device, which can insert a variety of working gases into discharge tube and generated plasma in aqueous solution. The plasma generated by the present invention can react with the aqueous solution to generate plasma activated water. By varying operating conditions of plasma, the plasma activated water will be abundant of free radicals and active chemical materials, which can improve the plants growth and disinfect microbes in an aqueous environment without impairing the growth of aquatic living bodies, such as fishes and shrimps.

In order to achieve the above mentioned objectives, the present invention proposes an atmospheric-pressure plasma jet generating device, which comprises a housing, a discharge tube arranged inside the housing, an air inlet, and an outlet disposed in the bottom of the housing. The air inlet interconnects with the outlet and the discharge tube. The discharge tube includes an internal electrode, a first dielectric material, and an external electrode. The first dielectric material is placed between the external electrode and the internal electrode and surrounds the internal electrode. The internal electrode provides channels inside the discharge tube. An external power source is electrically connected to the internal electrode and the external electrode through cables to generate a high electric field within the discharge tube. When an external gas flows into the discharge tube via the air inlet, the external gas is dissociated by the high electric field to generate plasma. Then, the plasma flows out of the discharge through the outlet.

In one embodiment, a first gap exists between the first dielectric material and the internal electrode; a second gap exists between the first dielectric material and the external electrode; the total sum length of the first gap and second gap is less than 0.3 mm.

In one embodiment, an external power source is electrically connected with the internal electrode or external electrode inside the discharge tube through cables.

In one embodiment, the internal electrode with channel has a cross section with a shape of a fan, at least one fan, multiple V notches, or multiple grooves.

In one embodiment, the external gas is air, nitrogen, argon, helium, carbon dioxide, or a combination thereof.

In one embodiment, the temperature of plasma jet ranges from 25 to 1370° C. in the discharge region; also, the plasma jet can insert under the water surface to generate plasma activated water.

In one embodiment, the housing includes a second dielectric arranged between the sidewall of the housing and the discharge tube. While the discharge tube is connected with an external power source, the second dielectric can prevent the external power source from discharging electricity to the housing.

Below, embodiments are described in detail in cooperation with the attached drawings to make easily understood the objectives, technical contents, characteristics and accomplishments of the present invention.

DETAILED DESCRIPTION OF THE INVENTION

The present invention utilizes a special channeled electrode having a total gap length less than 0.3 mm to generate a non-thermal atmospheric-pressure plasma jet. In the present invention, the atmospheric pressure means at standard atmospheric pressure. The temperature of non-thermal plasma is lower than the temperature of conventional thermal plasma. The temperature of conventional thermal plasma ranges from 100° C. to as high as 25000° C. The non-thermal plasma jet of the present invention is at a temperature lower than 100° C. Under certain conditions, its plasma plume can contact human bodies directly and it is safe to touch which may apply to biomedical applications. Under certain conditions, the non-thermal plasma jet of the present invention can enhance the reaction of active species by different chemical reaction pathway. For example, the reactive oxygen/nitrogen species (RONS) produced by the plasma jet of the present invention can inhibit/kill bacteria, promote cellular proliferation in a wound, and accelerate the wound healing process.

Figure 1:
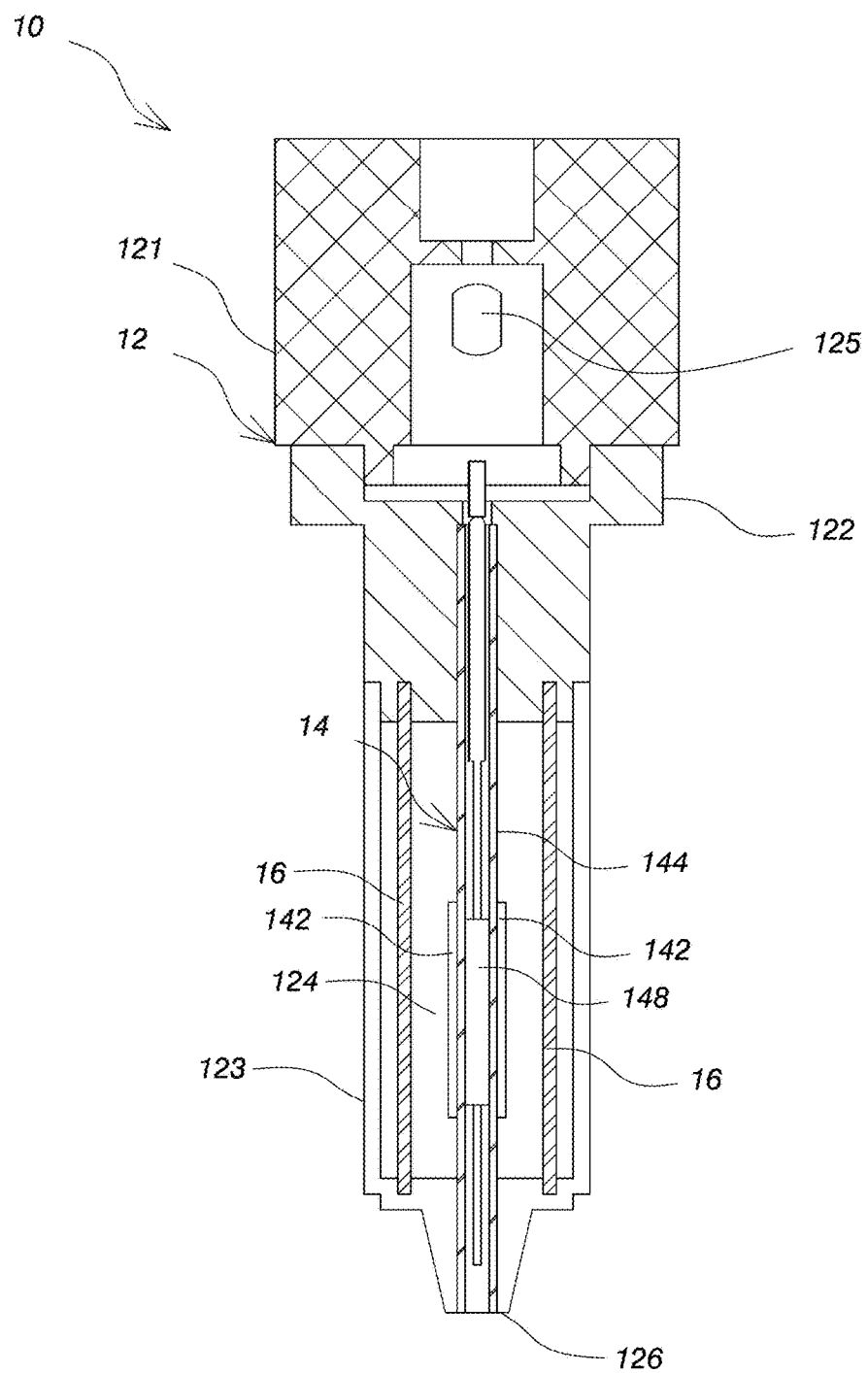
FIG. 1 is a sectional view schematically showing an atmospheric-pressure plasma jet generating device according to one embodiment of the present invention.
Figure 2:
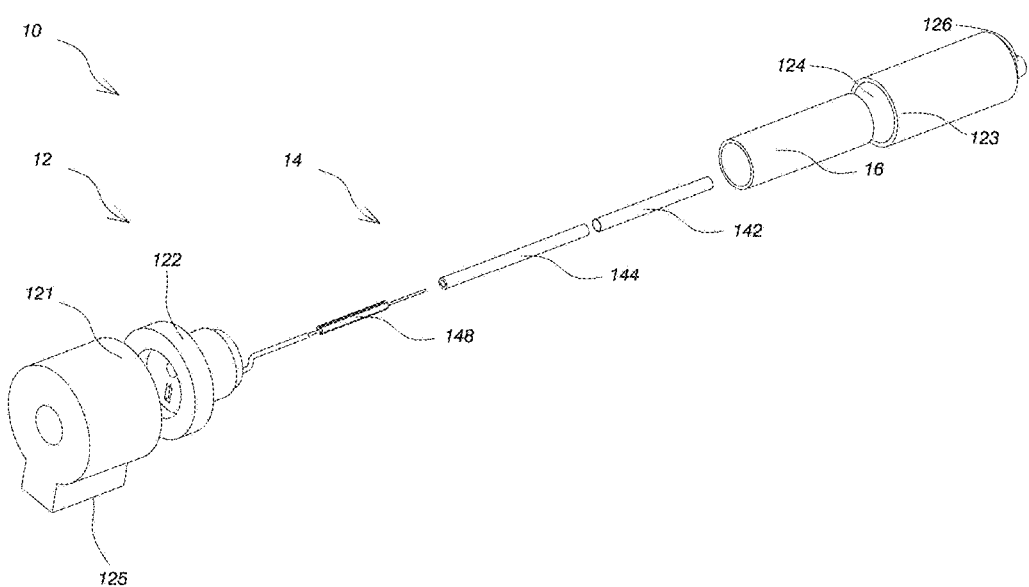
FIG. 2 is an exploded view schematically showing an atmospheric-pressure plasma jet generating device according to one embodiment of the present invention.

Refer to FIG. 1 and FIG. 2. In one embodiment, the atmospheric-pressure plasma jet generating device 10 of the present invention comprises a housing 12, a discharge tube 14, a second dielectric material 16. The housing 12 includes an upper housing 121, a connection part 122, and a lower housing 123. After the upper housing 121, the connection part 122, and the lower housing 123 are assembled together into the housing 12. An accommodation space 124 is formed inside the housing 12. The accommodation space 124 is mainly formed inside the lower housing 12. The accommodation space 124 mentioned herein is not to limit the scope of the present invention but only to convenience the description of the embodiments. The housing 12 has an air inlet 125 arranged on the lateral side of the upper housing 121. The housing 12 has an outlet 126 on the bottom of the lower housing 123. The air inlet 125, the discharge tube 14, and the outlet 126 are interconnected. The second dielectric material 16 and the discharge tube 14 are arranged in the accommodation space 124. The second dielectric material 16 is disposed between the discharge tube 14 and the sidewall of the lower housing 123. The discharge tube 14 is interconnected with the outlet 126 and the connection part 122. In this embodiment, the second dielectric material 16 is in form of a cylinder. However, the present invention is not limited by the above mentioned numbers or shapes of slot.

Figure 3:
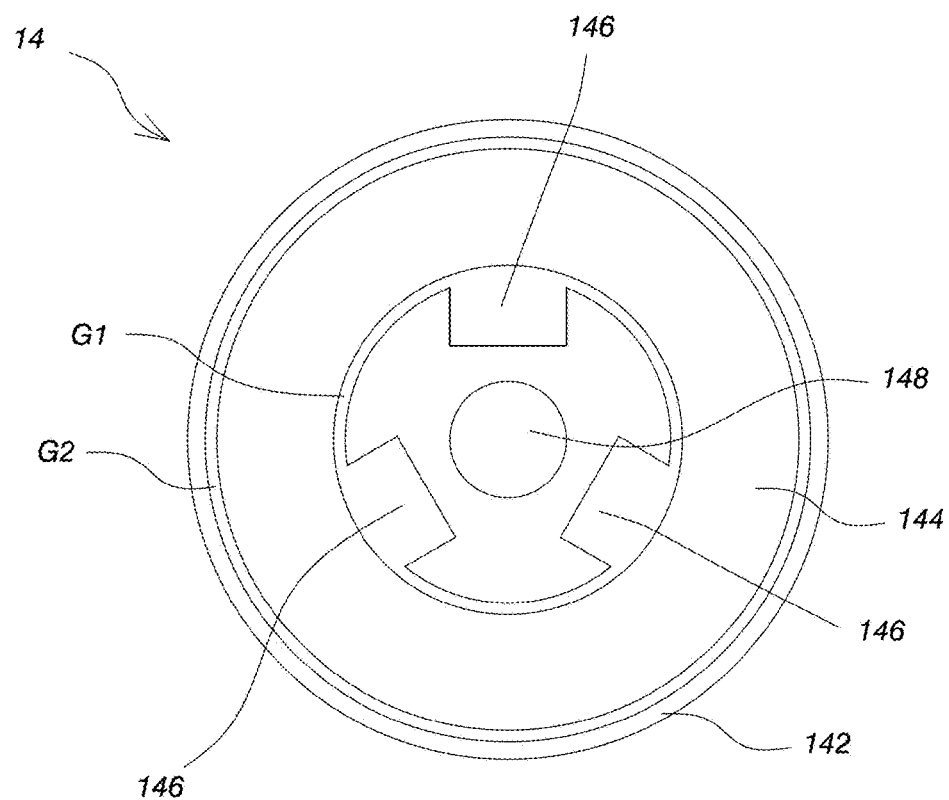
FIG. 3 is a cross-sectional view schematically showing a discharge tube of an atmospheric-pressure plasma jet generating device according to one embodiment of the present invention.

Refer to FIG. 3. In one embodiment, the discharge tube 14 includes an external electrode 142, a first dielectric material 144, and an internal electrode 148. The first dielectric material 144 is annularly disposed inside the external electrode 142. The internal electrode 148 is disposed inside the first dielectric material 144. The internal electrode 148 with channels 146. The present invention does not particularly limit the number of the channels 146. The number of the channels 146 vary with the shape of the internal electrode 148. In this embodiment, the cross section of the internal electrode 148 has three rectangular-section grooves, and the three rectangular-section grooves form three channels 146 inside the discharge tube 14. In some embodiments, the internal electrode 148 has a multi-groove cross section. However, the present invention is not limited by those embodiments. In the present invention, the cross section of the internal electrode may be designed according to requirement. A first gap G1 exists between the internal electrode 148 and the first dielectric material 144. A second gap G2 exists between the first dielectric material 144 and the external electrode 142. In the present invention, the total sum of the length of the first gap G1 and the length of the second gap G2 is less than 0.3 mm. However, the present invention neither limits the length of the internal electrode 148 nor limits the type of the first dielectric material 144.

Figure 4:
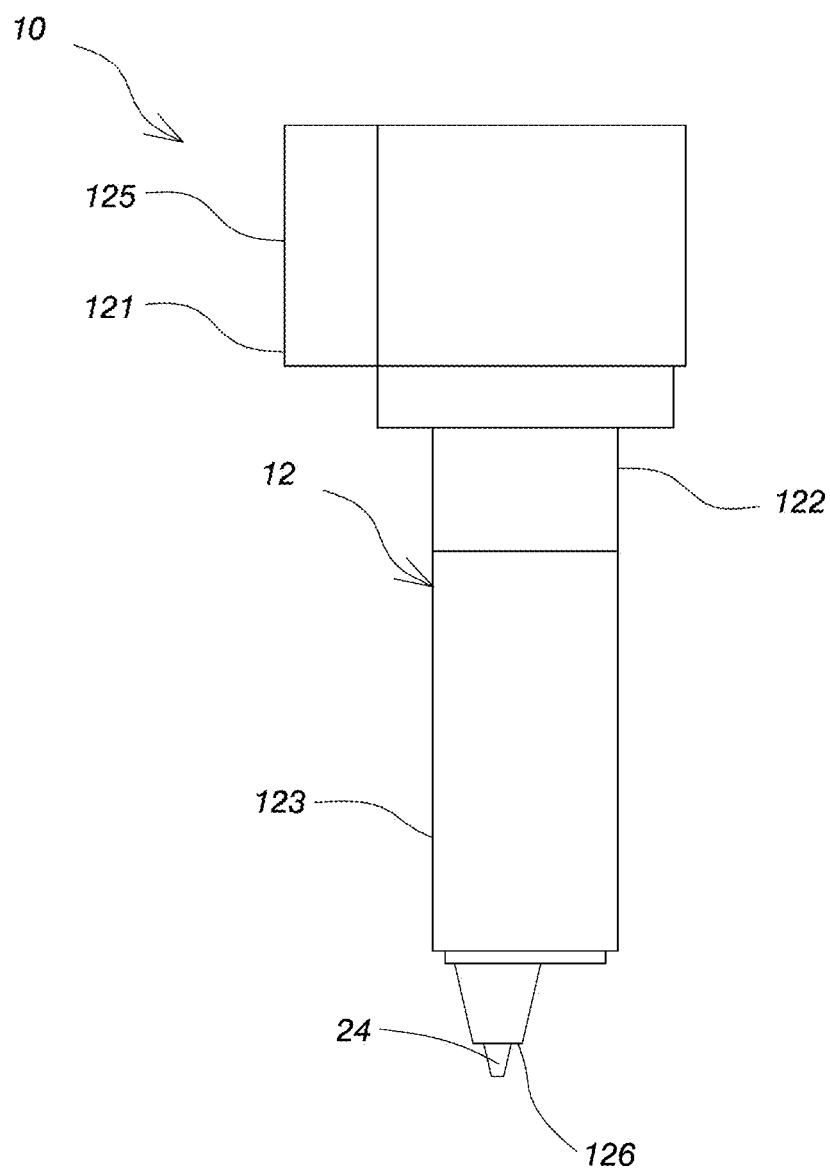
FIG. 4 is a diagram schematically showing that an atmospheric-pressure plasma jet generating device generates plasma according to one embodiment of the present invention.
Figure 5A:
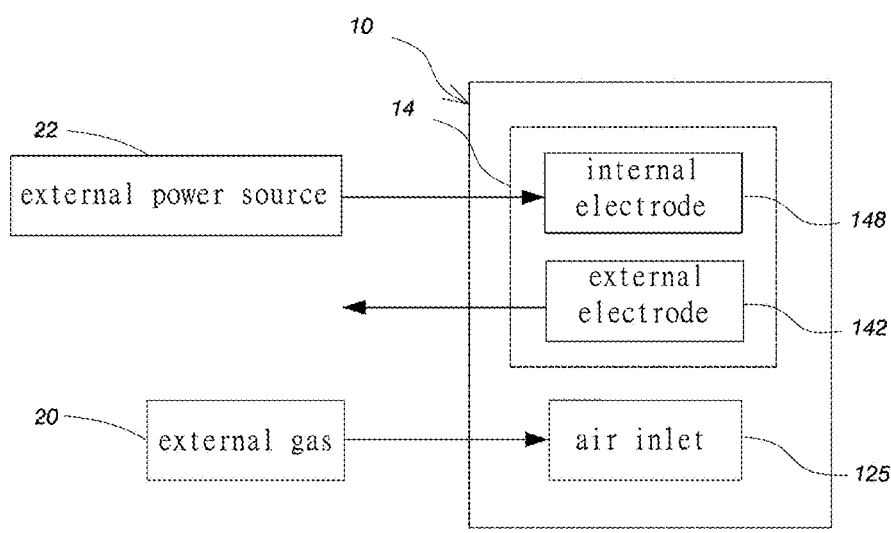
FIG. 5a is a block diagram schematically showing a filament mode according to one embodiment of the present invention.
Figure 5B:
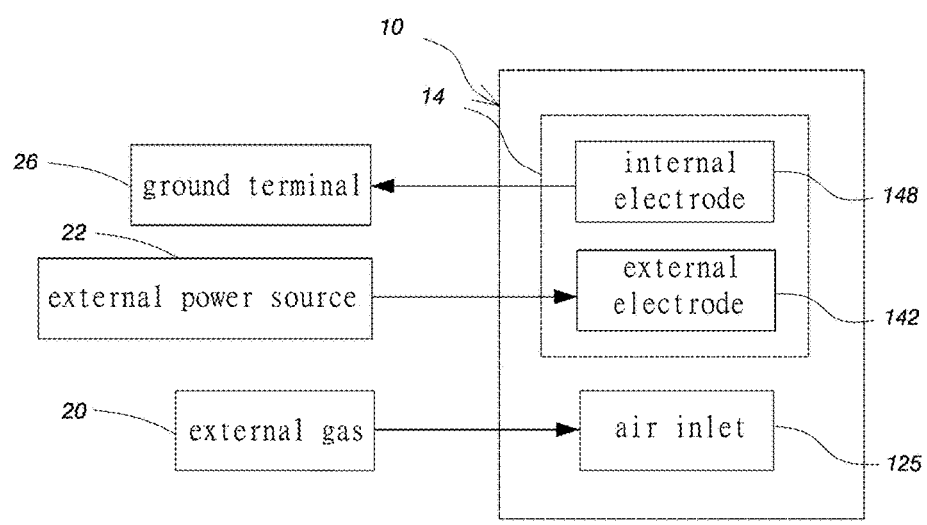
FIG. 5b is a block diagram schematically showing a glow mode according to one embodiment of the present invention.

After the structure of the present invention has been described above, the operation of the present invention will be described below. Refer to FIG. 4, FIG. 5a, FIG. 5b, and also refer to FIG. 1 again. The housing 12 receives an external gas 20 via the air inlet 125. The discharge tube 14 is electrically connected with an external power source 22. After entering the housing 12 via the air inlet 125, the external gas 20 flows through the discharge tube 14. Inside the discharge tube 14, the external power source 22 provides a high electric field between the internal electrode 148 and external electrode 142. Through the slot 146 of the internal electrode 148, The external gas 20 will be ionized to plasma state within the first dielectric 144. There are very small gap lengths between internal electrode 148 and first dielectric (the first gap G1) and external electrode 142 and first dielectric 144 (the second gap G2). The sum of the first gap G1 and the second gap G2 will greatly influence the intensity of plasma. Plasma 24 will generate in the internal electrode 148 and the channels 146 thereof, and plasma plume will create through the flow from the bottom of the housing 12 via the outlet 126. In FIG. 5a, the high-voltage terminal of the external power source 22 is electrically connected with the internal electrode 148 of the discharge tube 14; the ground terminal 26 of the external power source 22 is electrically connected with the external electrode 142; thereby is defined as filament mode. In FIG. 5b, the high-voltage terminal of the external power source 22 is electrically connected with the external electrode 142 of the discharge tube 14; the ground terminal 26 of the external power source 22 is electrically connected with the internal electrode 148; thereby is defined as glow mode. In the filament mode, the high-voltage terminal of the external power source 22 is electrically connected with the internal electrode 148; thereby, the filament mode has a higher density of plasma. On the contrary, the glow mode has a lower density of plasma. The user may shift the mode anytime according to requirement. No matter what mode is used, the generated non-thermal plasma 24 is at a lower temperature (near the room temperature). In the present invention, the external gas 20 may be selected from a group including air, nitrogen, oxygen, argon, helium, carbon dioxide, or combinations thereof. However, the present invention does not particularly limit the type of the external gas 20. The user may select an appropriate gas as the external gas 20 according to requirement. The second dielectric material 16 is mainly for insulation. While the discharge tube 14 is electrically connected with the external power source 22, the second dielectric material 16 prevents the external power source 22 from discharging electricity to the hosing 12 lest the user who holds the housing 12 be electrically shocked. The user may determine whether to use the second dielectric material 16 according to the material and thickness of the housing 12. The present invention does not demand that the second dielectric material 16 must be used.

Figure 6:
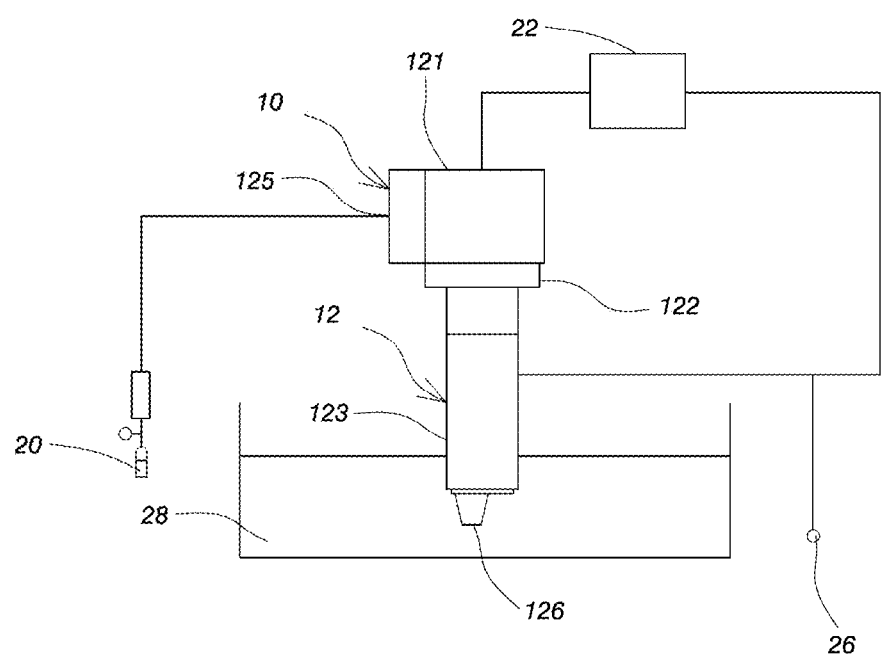
FIG. 6 is a diagram schematically showing that an atmospheric-pressure plasma jet generating device which is inserted under an aqueous solution surface according to one embodiment of the present invention.
Figure 7A:
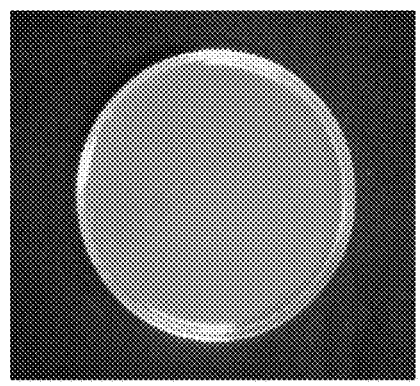
FIG. 7a is a photograph showing the result of a test where plasma activated water is used in disinfection according to one embodiment of the present invention.
Figure 7B:
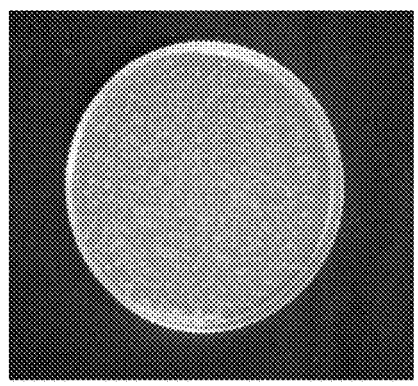
FIG. 7b is a photograph showing the result of a test where no plasma activated water is used in disinfection.

Refer to FIG. 6. The atmospheric-pressure plasma jet generating device 10 of the present invention can be inserted into an aqueous solution 28, using the external power source 22 and the external gas 20 to generate plasma under water surface. Then, the plasma reacts with the aqueous solution to generate plasma activated water, which is abundant of free radicals and active chemical species. In this embodiment, the filament mode is used as the exemplification. However, the present invention does not limit that plasma water must be generated in the filament mode or the glow mode. The user may select an appropriate mode to produce plasma water according to requirement. In an experiment, the plasma jet is operated in the conditions of an input power of 50 watts and a frequency of 10-100 kHz.; 100 ml of tap water is treated by plasma jet for 30 minutes to generate plasma activated water and then mixes with a *E. coli* bacteria suspension with a concentration of $10^7$ CFU/ml by a ratio of 100:1 (1 ml of the plasma activated water and 104, of bacteria suspension.) at a temperature of about 30° C. After 30 minutes reaction time with plasma activated water and bacteria suspension. 100 μL of the mixing solution is cultivated on the petri dish. The experimental result is shown in FIG. 7*a*. The experimental result shows that the plasma activated water almost kills all the bacteria and proves that the plasma activated water generated by the present invention indeed has the ability to inactivate bacteria. In the case that bacteria suspension without mixing with the plasma activated water, there are still many bacteria colony which can be observed on the petri dish, as shown in FIG. 7*b*.

Figure 8A:
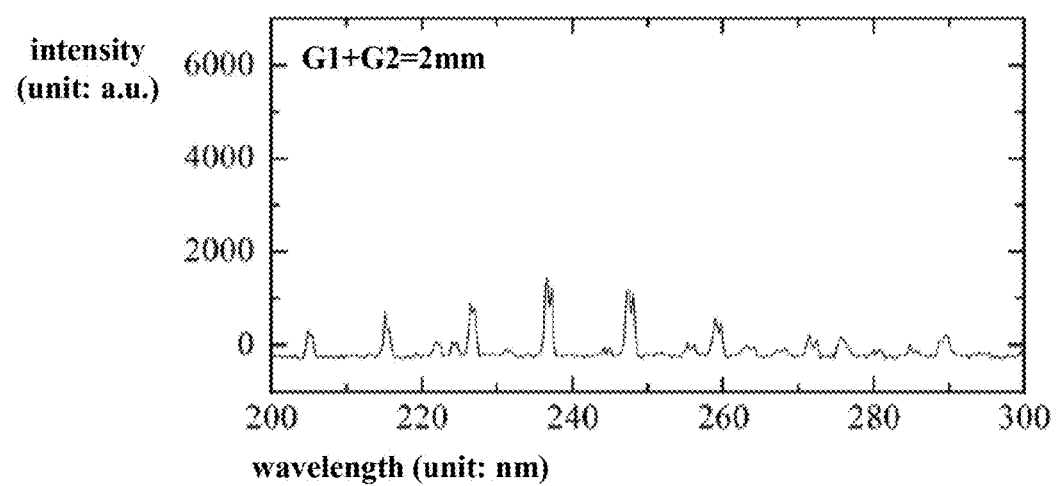
FIGS. 8a-8c show the results of the experiments respectively using different sums of the lengths of the first gap and the second gap according to embodiments of the present invention.
Figure 8B:
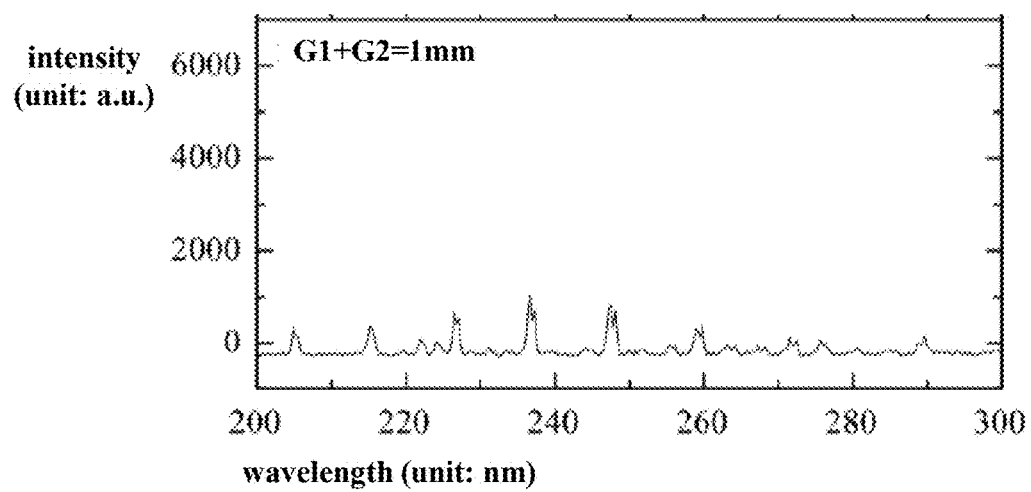
Figure 8C:
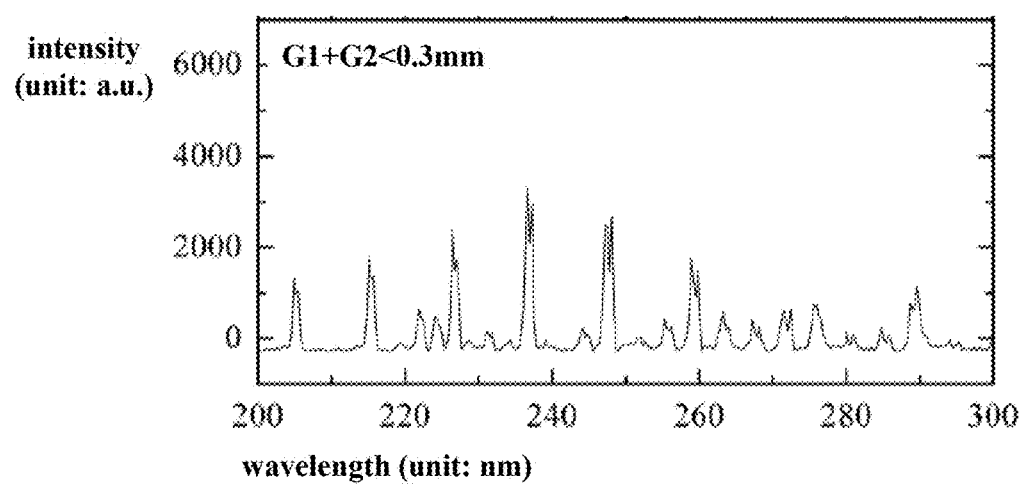
Figure 9A:
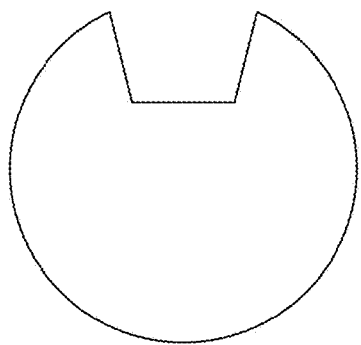
FIGS. 9a-9f show internal electrodes respectively having different cross sections according to embodiments of the present invention.
Figure 9B:
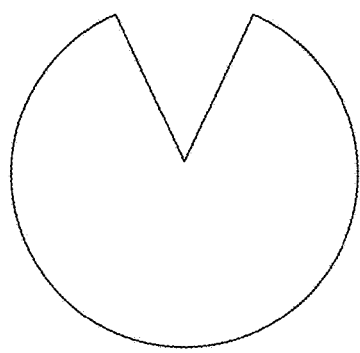
Figure 9C:
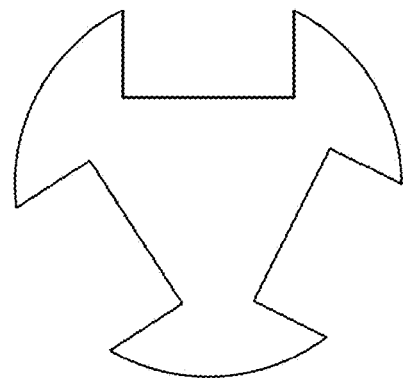
Figure 9D:
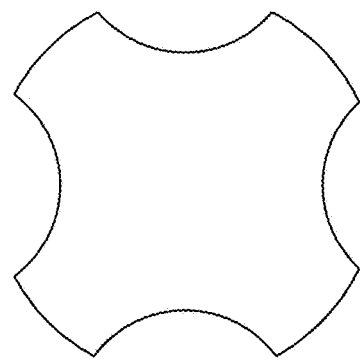
Figure 9E:
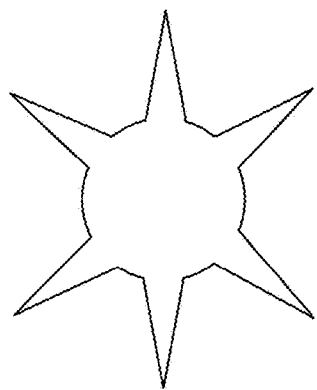
Figure 9F:
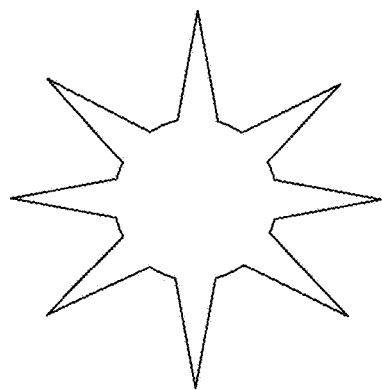

The present invention is characterized with channeled electrode and makes the electric field vertical to the flow direction. The present invention provides the high voltage of an external power source to dissociate a gas and create a non-thermal plasma jet. Although the temperature of the discharge is in the range from 25 to 1370° C., the operating temperature of the plasma jet ranges about from 25° C. to more than 30° C., which is much lower than the temperature of thermal plasma. If the user needs a higher plasma density, he may increase the power of the external power source to increase the plasma density and the plasma temperature will increase as well. Therefore, the user can control the power source to increase the temperature of the plasma jet in the present invention. No matter what the channel shapes of the electrode are, the factor that most directly influences the characteristics of the non-thermal plasma jet is the sum of the length of the first gap between the internal electrode and the first dielectric material and the length of the second gap between the first dielectric material and the external electrode (such as the first gap G1 and the second gap G2 shown in FIG. 3), which is demanded to be less than 0.3 mm. Refer to FIGS. 8*a*-8*c* for the plasma emission spectra within the wavelength range of 200-300 nm, which indicates that the plasma jet can generate a great amount of NO-γ. The sum of the lengths of the first gap G1 and the second gap G2 (G1+G2) is 2 mm in FIG. 8*a*, 1 mm in FIG. 8*b*, and less than 0.3 mm in FIG. 8*c*. It is found in FIGS. 8*a*-8*c*: the smaller the sum (G1+G2) is, the higher intensity emitted by the plasma. The plasma emission spectrum in FIG. 8*c* has the highest intensity. Refer to FIGS. 9*a*-9*f* In the present invention, the internal electrode has at least one channel. The cross section of the internal electrode with channel may have a V-shape, a rectangular shape, an arc shape, and a fan shape. However, the shape and number of the channels are not limited by the embodiments shown in FIGS. 9*a*-9*f*.

The plasma jet generating device of the present invention can ionize the neutral gas, which is hard to be ionized, to create a non-thermal atmospheric-pressure plasma jet which the plasma temperature is lower than the conventional plasma jet. The non-thermal plasma is in a low-level ionized state, containing abundant of highly active chemical species and high-energy particles, such as ions, free radicals, and free electrons. While applying to a living body, the non-thermal plasma would not harm the living body but still can disinfect the living body. Therefore, the non-thermal atmospheric-pressure plasma jet generating device of the present invention has very high potential in biomedicine, such as hemostasis, teeth whitening, and wound healing.

The embodiments described above are to demonstrate the technical thoughts and characteristics of the present invention and enable the persons skilled in the art to understand, make, and use the present invention. However, these embodiments are not intended to limit the scope of the present invention. Any equivalent modification or variation according to the spirit of the present invention is to be also included by the scope of the present invention.

What is claimed is:

1. An atmospheric-pressure plasma jet generating device comprising
a housing including a discharge tube, an air inlet, and an outlet, wherein said outlet is formed on a bottom of said discharge tube; said air inlet is interconnected with said discharge tube and said outlet; said discharge tube includes an internal electrode, an external electrode and a first dielectric material; said first dielectric material is annularly disposed between said external electrode and said internal electrode; said internal electrode provides channels inside said discharge tube; an external power source is electrically connected with said internal electrode and said external electrode through cables and provides a high electric field inside said discharge tube; while an external gas flows into said discharge tube via said air inlet, said high electric field inside said discharge tube ionize said external gas to generate atmospheric-pressure plasma; said atmospheric-pressure plasma flows out of said discharge tube through said outlet.

2. The atmospheric-pressure plasma jet generating device according to claim 1, wherein a first gap exists between said internal electrode and said first dielectric; a second gap exists between said first dielectric and said external electrode.

3. The atmospheric-pressure plasma jet generating device according to claim 2, wherein a sum of a length of said first gap and a length of said second gap is less than 0.3 mm.

4. The atmospheric-pressure plasma jet generating device according to claim 1, wherein said external power source is electrically connected with said internal electrode or said external electrode of said discharge tube through cables.

5. The atmospheric-pressure plasma jet generating device according to claim 1, wherein a cross section of said internal electrode with said channel may have but is not limited to have a shape of a fan, at least one fan, a plurality of V notches, or a plurality of grooves.

6. The atmospheric-pressure plasma jet generating device according to claim 1, wherein said external gas is selected from a group including air, nitrogen, oxygen, argon, helium, carbon dioxide, and combinations thereof.

7. The atmospheric-pressure plasma jet generating device according to claim 1, which generates a plasma jet with a temperature of 25-100° C.

8. The atmospheric-pressure plasma jet generating device according to claim 1, wherein said plasma is inserted under the water surface to form a plasma activated aqueous solution.

9. The atmospheric-pressure plasma jet generating device according to claim 1, wherein said housing further includes a second dielectric material disposed between a sidewall of said housing and said discharge tube; while said discharge tube is electrically connected with said external power source, said second dielectric material prevents said external power source from discharging electricity to said housing.

* * * * *